United States Patent [19]

Hadley, Jr. et al.

[11] Patent Number: 4,657,833
[45] Date of Patent: Apr. 14, 1987

[54] PHOTOSENSITIVE CATHODE FOR DEPOSITION OF METAL STRUCTURES WITHIN ORGANIC POLYMERIC FILMS

[75] Inventors: Henry C. Hadley, Jr., Elkton, Md.; Stephen Mazur, Wilmington, Del.

[73] Assignee: E. I. Du Pont de Nemours and Company, Wilmington, Del.

[21] Appl. No.: 828,405

[22] Filed: Feb. 11, 1986

[51] Int. Cl.$^4$ .............................................. G03G 17/02
[52] U.S. Cl. ........................................ 430/52; 430/31; 204/22
[58] Field of Search ............... 204/1 R, 29, 22; 430/2, 430/31, 52

[56] References Cited

U.S. PATENT DOCUMENTS 4,512,855  4/1985  Mazur ............................... 427/12 X Primary Examiner—John D. Welsh

[57] ABSTRACT

A photosensitive cathode is used to vary in three dimensions, the position, shape and density of a metallic interlayer formed in a preformed polymer film using an electrochemical deposition process.

10 Claims, 4 Drawing Figures

F I G. 3
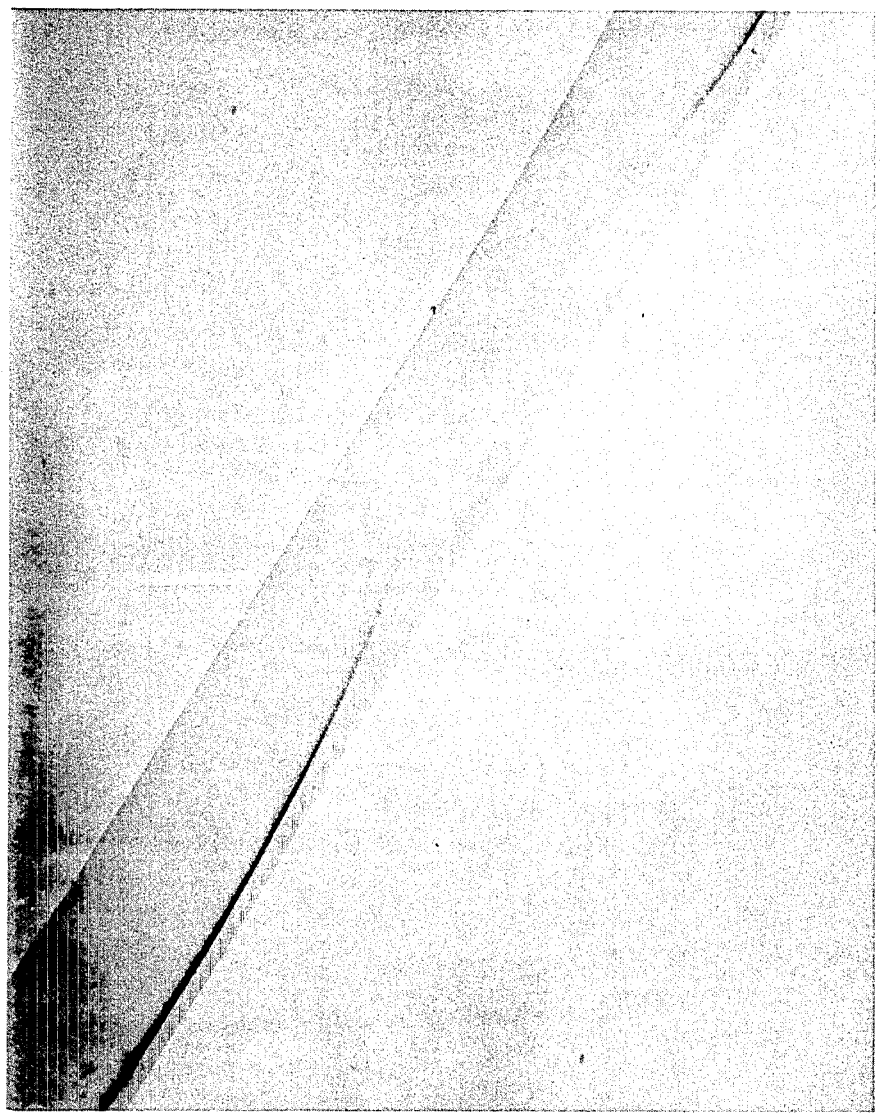

FIG. 4
1 MICROMETER

PHOTOSENSITIVE CATHODE FOR DEPOSITION OF METAL STRUCTURES WITHIN ORGANIC POLYMERIC FILMS

FIELD OF THE INVENTION

The present invention relates to the use of a photosensitive cathode as a means to regulate the electrochemical deposition of a metal within a preformed organic polymeric film. By means of the invention it is possible to create three-dimensional structures composed of metal particles distributed within the bulk of an organic polymeric film, in which the density, dimensions and position (in three dimensions) of these structures are uniquely determined by spatial and temporal intensity distributions of light projected onto the surface of the photosensitive cathode.

BACKGROUND OF THE INVENTION

Photoconductive materials have been widely exploited as the basis for various imaging processes. Several of these processes have employed a photoconductor as an electrode for controlling (with light) an electrochemical reaction. R. L. Carlson (Photographic Science and Engineering, Vol. 8, p. 167, (1964)), and E. G. Johnson and B. W. Neher (U.S. Pat. No. 3,010,883 (1950)) describe electrolytic photography processes in which a ZnO photoconductive (dark-insulating) cathode is used to reduce a metal salt ($Ni^{+2}$, $Cu^{+2}$, $Ag^+$) to the corresponding metal. Other photoconductors which have been employed in these and related applications include CdS and PbS, (R. E. Stralle, U.S. Pat. No. 3,623,287 (1971)) and Ge (G. Karadzhov and M. Igor, Izv. Otd. Khim Navki, Bulg. Akad. Nauk., Vol. 7, 331-338 (1974)). While the details of such processes vary in many respects, all produce images which are two-dimensional projections of the original image. Carlson reported depositing Ni in sufficient density to create an optically reflective image.

In only a few instances was the resolution of these photographic processes actually reported. However, the majority of examples involved relatively thick layers of granular, polycrystalline photoconductors (ZnO or CdS) which would not be capable of providing exceptionally good resolution. R. D. Weiss, (Photographic Science and Egineering, Vol. 11, 287-292 (1967)) reported resolution of 7-9 line pairs/mm (1 pm) for electrolytic conversion of a leuco dye using a photoconductive anode of this sort. Stralle described a device for making holographic recordings using a very thin (0.1 to 0.5 micrometer) film of CdS or PbS as a photoanode. Under the influence of light, these materials dissolved electrochemically, leaving a positive photographic image in the form of a pattern of holes etched in the photoconductive film. Line spacings as small as 1.5 micrometers (equivalent to 667 lpm) could be resolved with this technique.

Mazur (U.S. Pat. No. 4,512,855 (1985)), described an electrochemical process for creating metal interlayers within organic polymer films. This process relies upon the ability of certain electrochemically active polymer films to accept electrons from one surface of the polymer film while, simultaneously, metal ions diffuse into the polymer film from a solution at an opposed surface. When the transport properties for ions and electrons are suitable, and the redox potential for the polymer is negative with respect to that of the metal, a steady-state current density, I, can be established which corresponds to the electrodeposition of metal within the polymer film at a constant rate to form a discrete interlayer at a fixed distance, d, from the polymer/cathode interface. The magnitude of this current is related to the thickness of the film t, the transport parameters, the concentration of metal ions ($[M^{n+}]$ in solution, and the magnitude of the potential E at the polymer/cathode interface. The transverse location of deposition, d, is also determined by the same set of parameters. Therefore, both I and d may be controlled by appropriate selection of the process variables, particularly E and $[M^{n+}]$. These phenomena were demonstrated by examples involving a polyimide film with the metals Ag and Cu.

Metal interlayers can be grown imagewise, as described by Mazur, by restricting the supply of either electrons or ions to specified regions of the polymer surfaces. This phenomenon was demonstrated, for example, by the use of a patterned cathode on the one hand and a patterned ion-barrier mask on the other. Both of these methods effectively function as on/off switches, i.e., the current density may be only one of two values: zero or a normal value. Consequently the patterns so generated can vary in two dimensions in a plane parallel to the polymer surface. Also, multiple interlayers may be grown by altering one or more of the process variables. However, if two or more interlayers are to be deposited, each with an independent pattern which varies in two dimensions, then the cathode or ion-barrier mask would have to be changed.

SUMMARY OF THE INVENTION

The present invention provides a new dimension of control, making certain kinds of structures readily available which would otherwise have been very complicated or even impossible to achieve. This control is achieved by the influence of light on a photosensitive cathode, which can comprise either a photoconductive material or photovoltaic structure. A thin layer of a photosensitive material is interposed between an optically transparent primary electrode and the polymer film. In the case of a photoconductive material, in the dark the electrical resistance of the photoconductor must be sufficiently high that negligible current flows at potentials normally employed for interlayer deposition. Under the influence of light, the resistance of the photoconductor is reduced in relation to the intensity of the light, so that current may flow in the illuminated areas. This resistance influences the deposition process because it creates an ohmic drop in voltage between the primary electrode (behind the photoconductor) and the polymer/cathode interface. In the case of a photovoltaic cathode, an additional effect is created by the generation of a photovoltage whose magnitude is directly related to the light intensity. This photovoltage is also manifest as a difference between the potentials at the the primary electrode and the polymer/cathode interface.

Since both the rate and also the transverse location, d, of deposition are related directly to the potential, E, which appears at the polymer/cathode interface, the light intensity can be used to manipulate both of these important parameters. It therefore becomes possible to obtain metal patterns which can vary continuously in thickness, density, and position (d) within the polymer by providing suitable variations in illumination along the surface of the photosensitive cathode. Moreover, multiple independently patterned interlayers may be created simply by changing the pattern of illumination.

Still more complex three-dimensional structures can be generated by employing continuous variations of illumination in time.

The images recorded by the process of the present invention take the form of a metallic structure, or several metallic structures which are embedded within a polymer film. These structures may be sufficiently dense to constitute electrically continuous and optically reflective entities. The thickness, density, and depth (within the polymer) of the metallic structures may be varied from one region of the image to another. In other words, the recorded image can have a complex three-dimensional structure and is not simply a two-dimensionally varying, flat projection of the original pattern of light. Several independent images may be recorded at different levels within a single polymer film. Thus, a set of different images created by multiple exposures of the same polymer/cathode assembly may be distinguished subsequently from one another.

The present invention provides the ability to record photographic images of high resolution (approximately 500 lpm) where the image consists of a metallic structure embedded within a polymer film. It also provides the ability to produce photographic images which, depending upon the density, micromorphology, and distance of the metal structure from the external surface of the polymer, may appear dark (with variable optical density), metallic reflective, or even colored reflective by virtue of optical interference effects between light reflected from the metal and from the external surface.

The structures created by means of this invention may be used not only as graphic images, but also as certain electrical or optical components such as circuit patterns, mirrors or gratings. Therefore, while the metallic structures created by the process of the invention are sometimes referred to as images, they can in fact serve many other useful functions in addition to that of a graphic record.

In another respect, the invention provides the ability to fabricate electrically conductive circuit patterns, especially to create such circuit patterns directly, during the course of photo-illumination, where the information needed to create the pattern may be provided by a conventional photographic transparency or motion picture, or by various optical devices such as a camera, intensity-modulated scanned light source, interference pattern or hologram. The metallic structure which defines the circuit pattern may be three-dimensional in the same sense as described above (i.e. it may curve towards or away from the surfaces of the polymer film in which it is embedded or lie in a plane which is not parallel to these surfaces and it may also vary in thickness and/or density in different regions of the pattern.) The invention also provides the ability to create multilevel circuit patterns where different patterns are created at different levels within a single polymer film. By virtue of the three-dimensional topology of these patterns, they may be either electrically disconnected from one another or they may contact at specified locations within the patterns.

The present invention will simplify the fabrication of such multilayer patterns by requiring that only the optical parameters in the process (illumination pattern and intensity), need be changed in depositing each successive layer. This constitutes a considerable advance over conventional methods for fabricating such structures. The latter require repetition of multistep procedures for each successive layer to be produced, including, for example, lamination, photoresist coating, exposure, development, and metal etching.

BRIEF DESCRIPTION OF THE DRAWINGS

The Drawings consist of four figures which are described below.

FIG. 3—Transmission electron micrograph of a microtomed cross-section of a polyimide film with a three dimensionally variant Ag interlayer. The metal was deposited using a PC cathode illuminated with a combination of direct and diffracted light from a ronchi ruling (300 lines per inch). The microtome cut was perpendicular to the direction of the lines in the pattern. The polymer film is ca. 8 micrometers thick and the microtome section is ca. 0.1 micrometer thick.

FIG. 4—Transmission electron micrograph of a microtomed cross-section of a polyimide film (ca. 6 micrometers thick) containing a pair of independently patterned Ag interlayers. The scale bar is 1.0 micrometer long.

DETAILED DESCRIPTION OF THE INVENTION

Figure 1:
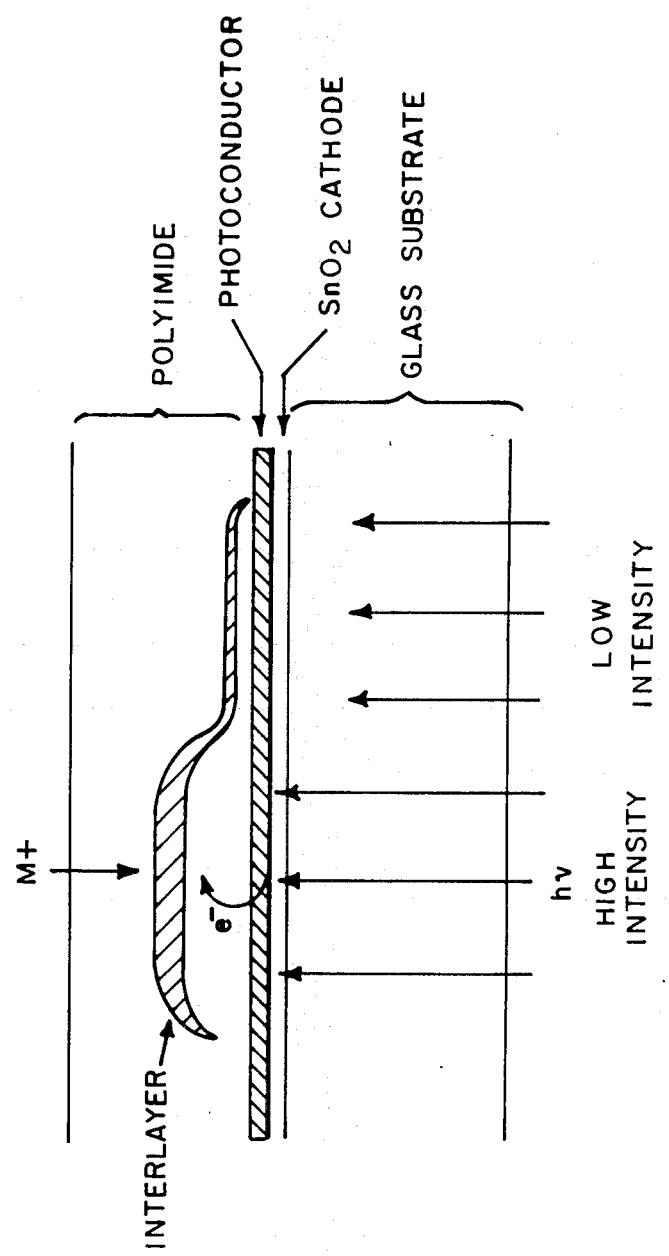
FIG. 1—A schematic drawing of a photosensitive cathode and polymer film containing a simple example of a three dimensionally variant interlayer. In this particular case the primary electrode is a conductivized glass.

The invention makes use of a photoconductive or photovoltaic cathode to regulate, by means of light which is incident upon this cathode, the electrochemical deposition of a metal interlayer(s) within a preformed organic polymeric film. The invention is applicable to the same polymers and metals employed in the metal interlayer deposition process as taught in U.S. Pat. No. 4,512,855, but, in one embodiment, employs as the cathode a structure (FIG. 1) composed of an optically transparent, electrically conductive primary electrode and a thin, continuous layer of a photoconductive material interposed between the primary electrode and the polymeric film, such that, in the dark, the electrical resistance across the thickness of this layer is substantially greater than the resistance measured between any two points along the surface of the primary electrode, and such that the resistance across the thickness of the photoconductor may be substantially reduced upon exposure to light. Alternatively, in another embodiment, the primary electrode may be used in conjunction with a thin, continuous photovoltaic structure or material, such that the voltage difference between the surface of the primary electrode and the outer surface (surface in contact with polymer) of this photovoltaic structure or material is made more negative in relation to the intensity of light which falls on it, such that the photovoltage generated under the influence of light absorbed by this photovoltaic structure alters the potential difference between the primary electrode and the polymer. Examples of suitable polymers include, without limitations, polyimides, particularly those derived from pyromellitic dianhydride and at least one diamine selected from the group consisting of: p-phenylenediamine, m-phenylenediamine, 4,4'-diaminodiphenylether, 4,4′-diamino-2,2′-bipyridine, 1,3-diaminomesitylene, 2,5-diaminopyridine, and 3,3′-diaminobenzophenone.

Whereas metal interlayers deposited by means of a conventional cathode consist of essentially planar structures or patterns which are homogeneous in thickness and density and lie parallel to the external surfaces of the polymer film, the metal structures created by means of a photoconductive or photovoltaic cathode can deviate substantially in these details and, in particular, their shape and density may be varied in all three dimensions.

Mazur (U.S. Pat. No. 4,512,855) teaches a process for making interlayers which are discrete laminar regions embedded within, and parallel to the surface of a polymeric film. The present invention provides a method for making interlayers comprising discrete three-dimensionally varying volume element(s) within the polymer film. The elements may consist of one or more contoured layers, mutually nonintersecting or intersecting, whose surfaces may lie at various angles relative to the external surfaces of the polymer. These layers may vary in thickness as a function of position along the contoured surface. The density of metal particles may also be varied as a function of position along the contoured surface.

The essential features of apparatus adapted to practice the present process are shown schematically in FIG. 1. The cathode consists of an optically transparent primary electrode which is coated with a thin, continuous layer of the photosensitive material. Optical transparency is required because the photosensitive layer must be exposed to the light source from the back side (i.e., the side opposite the polymer). This is because any light coming through the polymer which is incident upon the cathode will ultimately be absorbed by metal which is deposited in these regions. This kind of self-limiting behavior prevents the establishment of a steady-state which is required for producing dense, well defined interlayers.

The simplest choice of a primary electrode is a glass plate conductivized by a layer of tin oxide or indium/tin oxide. However alternative choices known to those skilled in the art may be equally satisfactory provided they are consistent with electrical and optical properties elaborated herein. Examples include thin evaporated metal films of gold and aluminum. The photosensitive layer must make good electrical contact with the primary electrode, and its properties must be more stringently specified.

The function of the photosensitive layer is to regulate the potential difference between the primary electrode (at an applied potential $E_{app}$) and the polymer/cathode interface (at potential E) in relation to the intensity of light which it absorbs. This function can be served by either a photoconductive effect or a photovoltaic effect or both.

A photovoltaic layer generates a photovoltage $V_p$ across its thickness direction in relation to the intensity of light absorbed. This photovoltage may be either positive or negative in sign and has the effect of altering the electrochemical potential E at the polymer/cathode interface. Photovoltages may be obtained using suitably fabricated junction devices (an example of which is discussed below) or they may be derived adventitiously from junctions between the photosensitive layer and the polymer or the primary electrode. Examples include p-n junctions and Schottky junctions.

A photoconductive layer functions by introducing an ohmic drop in potential proportional to the current density I, the area of the electrode A, and the resistance $R_p$ across the thickness of a 1 cm$^2$ section of the photosensitive layer. For a photoconductive material, $R_p$ will decrease with increasing intensity of light absorbed. Examples of photoconductive materials include Si, Ge, CdS, TiO$_2$, and ZnO. The following equation summarizes the relationship between $E_{app}$ and E for a photosensitive cathode which, under a particular intensity of illumination, has a characteristic photovoltage $V_p$ and resistance $R_p$:

$$E = E_{app} + V_p + IR_pA \qquad (1)$$

E and $E_{app}$ are electrochemical potentials defined relative to a reference electrode consisting of the metal salt solution and the metal at equilibrium, as represented by the half cell $[M^{n+}]/M°$. (In order for the process to function, E must be negative in sign. Cathodic current has a positive sign in the present convention.) As used herein, all potentials, E, are measured relative to the redox potential of the metal $E_m°$.

In cases where $V_p$ is negative in sign and sufficiently large in magnitude, It is possible to dispense with an externally applied potential, $E_{app}$. The external connections between the cathode and anode could simply be shorted to one another and the process driven entirely by the photovoltage. The use of an applied potential does, however, provide an additional control factor as elaborated below.

The remaining discussion will focus on the details of how a photosensitive cathode functions. In any particular situation, depending upon the exact details of the cathode, one or the other of the two photosensitive terms ($IR_pA$ and $V_p$) may predominate.

For cases where the photoconductive effect is more important, $R_p$ generally will not be the only series resistance encountered between the source of applied potential and the polymer. In order that the photomodulation of $R_p$ be effective in regulating the process, it is necessary that $R_p$ be large relative to the sum of all other such resistances. The most important of these will be the resistance of the primary electrode itself. For the particular case of a conductivized glass primary electrode this corresponds to a surface resistance. For such a case it would then be necessary that $R_p$ (under all intensities of illumination) be much greater than the resistance along the surface of the photoconductor.

Equation 1 alone is insufficient to determine the rate, I, or transverse location, d, of metal deposition. As for the present process in general, these parameters are determined by a combination of transport characteristics for the metal ions and electrons and the boundary conditions established by the process variables. As described in U.S. Pat. No. 4,512,855, I and d may be related to the transport parameters and boundary conditions according to a simple diffusion model as follows:

$$I = FJ_e = FD_e[P^-]^*/d \qquad (2)$$

$$[P^-]^* = [P](1 + \exp(nF/RT(E - E°)))^{-1}$$

$$d/t = (1 + nD_mK_s[M^{n+}]/D_e[P^-]^*)^{-1} = 1 - I_s/I$$

where $$I_s = FD_mK_s[M^{n+}]/t \qquad (5)$$

and all of the remaining parameters are the same as defined in the above references. These equations are valid for the conditions $I \geq I_s$ where d is $>0$ (less than t). For more positive values of E, such that the polymer cannot accept electrons, the metal may deposit directly at the polymer/cathode interface ($I<I_s$ and $d=0$) according to the following equation:

$$I=(FD_m K_s[M^{n+}]/t)\{1-\exp(nFE/RT)\} \quad (6)$$

Combining equations 1 with 5 and 6 gives the following relations between photosensitive parameters ($V_p$ and $R_p$) and the other process variables:

For $I_{max} > I > I_s$, $d > 0$ (7)

$$(nF/RT)(E_{app} - E^\circ + V_p + R_p IA) = \ln[(I_{max} - I)/(I - I_s)]$$

where $$I_{max} = I_s + FD_e[P]/t \quad (8)$$

and

For $I_s > I > 0$, $d = 0$ (9)

$$(nF/RT)(E_{app} + V_p + R_p IA) = \ln[(I_s - I)/I_s]$$

Figure 2:
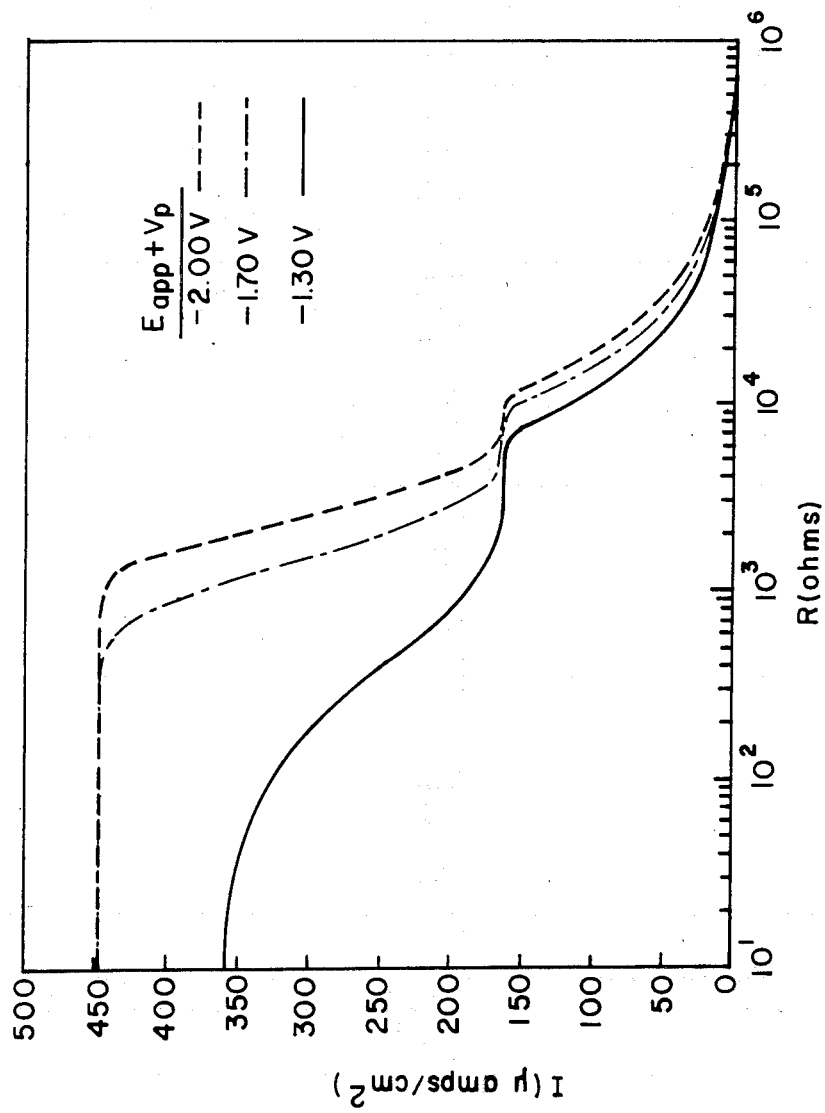
FIG. 2—Calculated dependence of I on $R_p$ for various values of $E_{app}$. Parameters were as follows: $D_m K_2 = 1.7 \times 10^{-7}$ cm$^2$/sec, $D_e = 0.8 \times 10^{-9}$ cm$^2$/sec, $[M^{n+}] = 0.01$M, $[P] = 3.67$M, $E° = -1.25$ V, and $t = 10$ micrometers.

Some representative plots are shown in FIG. 2 of I versus $R_p$ for various values of $E_{app}$ for the case of a photoconductive cathode ($V_p$ assumed negligible). The parameters used in these calculations correspond to electrodeposition of Ag° in a 10 micrometer thick film of the polyimide derivative from 4,4'-oxydianiline and pyromellitic dianhydride (ODA/PMDA) from a N,N'-dimethylformamide solution 0.01M in AgBF$_4$ and 0.10M in KPF$_6$; namely $I_s = 1.64 \times 10^{-4}$ A/cm$^2$, $I_{max} = 4.47 \times 10^{-4}$ A/cm$^2$, and $E^\circ = -1.25$ V.

It may be noted that I may approach $I_{max}$ only for sufficiently negative values of $E_{app}$ and that the range of $R_p$ needed to control I over the range 0 to $I_{max}$ is also dependent on $E_{app}$. For a photoconductive cathode in which the active element is a 0.50 micrometer layer of amorphous hydrogenated silicon (a-Si:H), the dark resistance, $R_p^\circ$, is $5 \times 10^4$ ohms, while under strong illumination $R_p$ may be reduced to less than 100 ohms, (data from J. Geiger, Thin Solid Films, Vol. 126, 1–10 (1985)). Thus, for $E_{app} = -1.50$ V and $I_s$ and $I_{max}$ the same as in FIG. 2, such a cathode would be capable of regulating I within the range from $2.95 \times 10^{-5}$ A/cm$^2$ to $4.43 \times 10^{-4}$ A/cm$^2$, a modulation range of 15:1. This range is sufficient to create electrically continuous interlayers in regions of strong illumination while simultaneously limiting deposition of metal at the polymer/cathode interface in unilluminated regions to a negligible level. Moreover, when the cathode is exposed to a range of different light intensities (different values of $R_p$), it is also possible to have different regions of the interlayer grow to different thicknesses and at different transverse locations d (via equation 4), corresponding to the value of I.

Response to the deposition process to the values of $R_p$ and $V_p$ depends upon the process parameters $E_{app}$, $I_s$ and $I_{max}$ ($E^\circ$ and the transport parameters are determined by the choice of polymer and metal salt solution). $I_s$ and $I_{max}$ both vary inversely with t, while $I_s$ is more strongly influenced by $[M^{n+}]$ than is $I_{max}$. It is, therefore, possible to alter both the absolute and relative magnitude of these parameters in order to obtain a response suited to the characteristics of a particular photosensitive cathode. Thus by decreasing both t and $[M^{n+}]$ one may increase the difference between $I_{max}$ and $I_s$ and also the modulation range for a given variation of $R_p$. However, even with this degree of control it will not always be possible to overcome limitations in the characteristics of the cathode.

The following scheme may be employed to determine the necessary requirements for a photosensitive cathode to be employed with any given choice of process variables. Consider the requirement that I be modulated between a minimum value equal to a fraction, $\epsilon$, of $I_s$ and a maximum value equal to a fraction, $\delta$, of $I_{max}$. Equation 10 specifies the value of the dark resistance $R_p^\circ$ required to achieve the lower limit of I, while equation 11 specifies values of $R_p$ and $V_p$ under maximum illumination intensity needed to achieve the upper limit.

$$R_p^\circ = \frac{(RT/nF)\ln(1-\epsilon) - E_{app}}{\epsilon I_s A} \quad (10)$$

$$R_p = \left(\frac{1}{\delta I_{max} A}\right)\left[E^\circ - E_{app} + V_p + \left(\frac{RT}{nF}\right)\ln\left(\frac{I_{max}(1-\delta)}{\delta I_{max} - I_s}\right)\right] \quad (11)$$

In practice, one would first compute the maximum (least negative) value of $E_{app}$ which satisfies equation 11 and then determine whether relation 10 may also be satisfied for the same imposed conditions. This evaluation can be made from knowledge of the thickness and photoelectric characteristics of the photosensitive layer; namely the dark resistivity, and photoresistivity and photovoltage under saturation illumination.

For example, assuming negligible $V_p$ and given the same set of process parameters described above for Ag deposition in PMDA/ODA polyimide, a 0.5 micron a-Si:H photoconductive cathode provides control within the limits $\epsilon = 0.18$ and $\delta = 0.99$. On the other hand a Cu-doped CdS film with $R_p^\circ$ also approximately $5 \times 10^4$ ohms but a minimum $R_p$ of $5 \times 10^3$ ohms (data from "Photoconductivity of Solids" by R. H. Bube, John Wiley, 1960, p. 172) would provide a regulation only within the range $\epsilon = 0.18$ and $\delta = 0.37$ for a modulation range of only 5.6:1. The latter conditions are inappropriate for growing an interlayer since the maximum value of I would correspond to deposition very close to the cathode surface (d/t=0.008). In extreme examples, with undoped CdS ($R_p^\circ = 5$ ohms) or a-Ge ($R_p^\circ$ 10 ohms, C. H. Seager et. al., in "Amorphous and Liquid semiconductors", J. Stuke and W. Brenig Eds., p 1134, Halsted Press, 1974) it would not be possible to satisfy equation 10 for any value of $E_{app}$ negative of $E^\circ$, which is an essential condition for interlayer deposition. Thus the characteristics of the photosensitive layer are crucial to the successful operation of the process, and these characteristics may be evaluated according to the above analysis.

A further restriction on the photoconductor is related to resolution. Photographic resolving power will decrease as the thickness of the photoconductive layer is increased because free charge carriers produced by illumination can diffuse in the directions perpendicular to the electric field. Since the electrical resistance of the cathode is inversely proportional to the thickness, the optimum thickness will represent a balance between these two factors and will be dictated by the bulk resistivity of the photoconductor.

In the examples which follow two forms of photosensitive cathodes were employed, photoconductive (PC) and photovoltaic (PV). The PC cathode consisted of a tin oxide conductivized glass plate with a 0.5 micrometer film of intrinsic amorphous hydrogenated silicon (a-Si:H). The PV cathode was the same basic construction but in this case the a-Si:H layer consisted of three successive laminar domains doped p-type, i, and n-type respectively, with the p-type region in contact with the primary electrode. (These cathodes were obtained from Solarex Corporation, Thin Film Division, Newton, Pa., see D. E. Carlson in "Semiconductors and Semimetals" Vol. 21, part D, J. I. Pankove Ed., Academic Press (1984).)

EXAMPLE 1

Samples and Apparatus

PC and PV cathodes were coated with a film of ODA/PMDA polyimide (ranging in thickness from 5 to 10 micrometers) using the same methods described in U.S. Pat. No. 4,512,855 (Example A). They were installed in an electrochemical cell similar to that described in U.S. Pat. No. 4,512,855 (Example B, and Figure). The cell was filled with a solution of 0.10M $KPF_6$ in acetonitrile containing $AgBF_4$ at various concentrations. The cathode was attached as the working electrode to a potentiostat (Princeton Applied Research Model 178), while two silver wires served as the reference and auxiliary electrodes. In the examples which follow, various patterns of light were projected onto the outside surface of the cathode (backside of the conductivized glass). These patterns were obtained by focusing an image from a slide projector onto the cathode surface, or by placing a photomask in contact with the back of the cathode and illuminating the photomask by means of a projection lamp (tungsten halide filament) or a He/Ne laser.

EXAMPLE 2

Effect of Light Intensity on Interlayer Location

A PC cathode (2"×2" square) coated with an ODA/PMDA polyimide film was mounted in the cell which was filled with 0.10M $KPF_6$, 0.01M $AgBF_4$ in acetonitrile. The back of the primary electrode was masked by a photographic transparency consisting of ten stepped zones of calibrated optical densities ranging from 0.07 to 1.26. The light source was a tungsten halide projection lamp with a collimating lens. The potential of the primary electrode was adjusted to $-1.40$ V vs $Ag/Ag^+$ and the lamp was turned on. Deposition was continued until a total of 0.70 coulombs had been passed. The sample was removed from the cell, washed with methanol and air dried. The pattern of the photomask was clearly visible as a negative image viewed in transmission. Viewed in reflected light, those regions corresponding to the highest light intensity (greatest Ag incorporation) appeared as reflective metallic mirrors while the less exposed regions were noticeably less reflective. Those zones exposed to lowest light intensities appeared dark black.

The distance between the interlayer and the outer surface of the polymer film (t-d) was determined for each of the different exposure zones by recording specular reflectance spectra in the region between 1500 and 400 nm and calculating according to the following equation:

$$t-d = \Delta N(\lambda 1)(\lambda 2)/2n_D(\lambda 1 - \lambda 2) \quad (12)$$

where $\Delta N$ is the number of interference fringes counted between wavelengths $\lambda 1$ and $\lambda 2$ and $n_D$ is the index of refraction (1.78). The polymer film was determined to be 6.40 micrometers thick. Results are tabulated below:

| zone | O.D. | t-d (micrometers) | d/t |
|---|---|---|---|
| 1 | 0.07 | 0.67 | 0.895 |
| 2 | 0.20 | 0.78 | 0.878 |
| 3 | 0.36 | 0.73 | 0.886 |
| 4 | 0.51 | 1.03 | 0.839 |
| 5 | 0.66 | 1.45 | 0.773 |
| 6 | 0.82 | 1.85 | 0.711 |
| 7 | 0.96 | 2.31 | 0.639 |
| 8 | 1.12 | 2.87 | 0.552 |
| 9 | 1.26 | 6.14 | 0.041 |
| UNEXPOSED | — | 6.40 | 0.00 |

EXAMPLE 3

Photoregulation of Interlayer Density, Optical Diffraction Effects

A PC cathode was coated with a polyimide film and mounted in the cell as above (0.10M $KPF_6$, 0.01M $AgBF_4$ in acetonitrile). The back of the cathode was masked by a ronchi ruling (Edmund Scientific) consisting of parallel lines, 300 line pairs per inch (lpi). The potential was adjusted to $-1.30$ V, and the photomask was illuminated with a He/Ne laser. The current stabilized at about 0.14 $mA/cm^2$ and deposition was continued until 0.06 $coul/cm^2$ had been passed. The polymer film was peeled from the cathode and analyzed by optical microscopy. The metal interlayer was visible as a series of optically dense lines ca. 40 microns wide separated by ca. 40 micrometers. In the regions between these lines the film was transparent, but the optical density was still greater than that for totally unexposed regions of the film, indicating that $Ag^\circ$ was also present in regions between the lines, but at much lower density.

Because of the fact that the photomask is separated from the photoconductor by the thickness of the primary electrode, light rays diffracted by the photomask will diverge and impinge upon areas not subject to direct (parallel ray) illumination. Diffraction effects were evidenced by a series of thin (ca. 2 micrometers thick) lines spaced at regular (ca. 10 micrometers) intervals between the principal lines of image. Transmission electron micrographs were recorded of microtomed cross-sections of the film. FIG. 3 shows one such micrograph. It is apparent that both the position (d/t) and the density of the interlayer vary dramatically between regions of direct and diffracted illumination.

EXAMPLE 4

Resolution Test for Deposition using a PC Cathode

An experiment similar to Example 3 was carried out using as the photomask a high resolution Cr-on-glass resolution test pattern consisting of bars and spaces. Because of the diffraction effects discussed above, the image created in the interlayer was not a simple reproduction of the photomask image, but included a complex pattern of fine lines created by diffraction fringes which are generated at the edges of patterns on the photomask. Among one set of fringes, a pair of dark lines were observed using optical microscopy which were separated by 2.3 micrometers and were ca. 1 micrometers thick.

EXAMPLE 5

A Pair of Independently Patterned Interlayers

A PC cathode coated with polyimide was mounted in the cell as in the previous two examples. A ronchi ruling (31 lpm) was mounted in contact with the back of the cathode, and the cell was filled with 0.10M KPF$_6$, 0.01M AgBF$_4$ in acetonitrile. The cell was illuminated by a tungsten projection lamp while the potential of the cathode was maintained at $-1.40$ V. (In the absence of a light source, the current was less than 10 microamps/cm$^2$.) With illumination the deposition was carried out at 0.2 mA/cm$^2$ until a total of ca. 0.05 coul/cm$^2$ had been deposited. The lamp was turned off and the cell circuit opened while the ronchi ruling was rotated by 90° in the plane of the cathode. Deposition was then continued at the same applied potential. Deposition was continued to give a total incorporation of ca. 0.1 coul/cm$^2$.

The sample was washed, dried and examined under the optical microscope. The two sets of parallel lines were clearly observed as reflective metallic layers. The set of lines deposited during the first period of deposition appeared to cross over the top of the second set of lines perpendicular to it. When the sample was peeled from the surface of the cathode and viewed from the reverse side, the set of lines deposited during the second stage of deposition appeared to cross over the first set. These relationships were confirmed by transmission electron micrographs taken of microtomed cross-sections of the pattern. FIG. 4 shows one of these micrographs. The polymer film is 5.7 micrometers thick, one of the first set of lines appears as a dark continuous band located 4.7 micrometers from the cathode surface while part of one of the second set of lines appears as a band situated 3.4 microns from the cathode surface which bends backwards to the cathode surface at its edge. This curvature is caused by the fall off in light intensity which occurs at the edge of the imaged lines. Similar micrographs taken near the edge of the first set of lines show that their edges also curve back towards the cathode surface.

EXAMPLE 6

Photovoltaic Cathode

A PV cathode, as described in Example 1, was coated with a polyimide film and mounted in the cell as described in previous examples. The cell was filled with 0.10M KPF$_6$, 0.01M AgBF$_4$ in acetonitrile. No external voltage source was employed. Instead the cathode and anode were shorted to one another by means of external wire. The cell was illuminated with a slide projector using the same stepped optical density scale described in Example 1 as the projected image. After several minutes of exposure, the sample was removed from the cell, washed and dried. The projected image was clearly visible as a dark pattern located at the cathode/polymer interface. This demonstrates the feasibility of using a PV cathode and having it operate under its own self-generated photovoltage.

EXAMPLE 7

Mutually Intersecting Patterns

A PC cathode coated with polyimide as in the previous example was mounted in the cell with 0.10M KPF$_6$, 0.01M AgBF$_4$ in acetonitrile. The cell was operated at an applied potential of $-1.40$ V and the sequence of illumination was as follows. A pattern of parallel lines (5 mm wide) was projected from a slide projector through a 0.30 optical density filter while 0.1 coul/cm$^2$ were deposited. The image was then rotated by 90° and illumination was resumed using a 1.20 optical density filter while an additional 0.11 coul/cm$^2$ were deposited. The entire sequence required 17 minutes. The sample was removed from the cell washed and dried.

The pattern appeared as two sets of metallic reflective lines lying perpendicular to one another with the first deposited set lying on top of the second (ie farther from the cathode). The precise locations of these layers was determined using specular reflectance spectroscopy. The uppermost layer was found to be 0.89±0.05 micrometers from the polymer surface while the second layer was located 0.46±0.05 micrometers from the the polymer surface. Consequently, these layers appeared highly colored when viewed in white light due to the strong interference of the light reflected from polymer and interlayer surfaces. (The polymer film was 5.9 micrometers thick).

Despite the measurable differences in the distances of these two layers from the polymer surface, they were shown to be in electrical contact with one another. This was demonstrated by the fact that when electrical contacts were made through holes in the film, the same resistance (ca 250 ohms) was measured between holes in two lines which crossed as between two holes in the same line. The electrical contact between the layers is presumed to occur at the edges of the uppermost layer where it crosses the lower layer.

I claim:

1. In a metal layer deposition process by means of which a metal having a redox potential $E_m°$ is deposited in its zero valent state within a preformed film of an organic polymer having a redox potential $E_p°$ which is more negative than or equal to $E_m°$, the film having first and second surfaces, the process comprising:
    (1) supplying ions of the metal to be deposited to at least a portion of the first surface, the metal ions being in a positive oxidation state and in a coordination state such that they are mobile within the polymeric film and are transported through the film in a general direction toward the second surface; and
    (2) supplying electrons to at least a portion of the second surface by a cathode in an electrochemical circuit comprising the cathode and an anode in electrical communication with the ions of the metal to be deposited, the polymeric film being capable of accepting electrons in a reversible manner at the second surface, and the electrons being mobile within the polymeric film and being transported through the film in a general direction toward the first surface;

the improvement comprising:
    (1) utilizing a cathode comprising an optically transparent primary electrode and a photosensitive layer interposed between the primary electrode and the second surface of the polymeric film; and (2) illuminating the photosensitive layer through the optically transparent primary electrode at a preselected spatial and temporal intensity distribution, thereby imparting to the process the ability to vary the dimensions, topography, metal density and position of the metal layer within the preformed polymeric film.

2. The process of claim 1 wherein the primary electrode is a tin oxide conductivized glass.

3. The process of claim 1 wherein the photosensitive layer comprises a photoconductive material.

4. The process of claim 3 wherein the dark resistance measured across the thickness of a 1 cm$^2$ area of the photoconductive layer is at least 10$^3$ ohms and the photomodulation is at least two orders of magnitude.

5. The process of claim 3 wherein the dark resistance measured across the thickness of a 1 cm$^2$ area of the photoconductive layer is at least 10$^4$ ohms and the photomodulation is at least two orders of magnitude.

6. The process of claim 4 wherein the photoconductive material is amorphous hydrogenated silicon.

7. The process of claim 1 wherein the photosensitive layer comprises a photovoltaic structure.

8. The process of claim 7 wherein the photovoltaic structure is a layer of amorphous hydrogenated silicon, doped sequentially along its thickness direction in laminar domains which are p-type, i-type and n-type, respectively, the p-type domain being in contact with the primary electrode.

9. The process of claim 1 wherein the polymer is a polyimide.

10. The process of claim 9 wherein the polyimide is derived from pyromellitic dianhydride and at least one diamine selected from the group consisting of: p-phenylenediamine, m-phenylenediamine, 4,4'-diaminodiphenylether, 4,4'-diamino-2,2'-bipyridine, 1,3-diaminomesitylene, 2,5-diaminopyridine, and 3,3'-diaminobenzophenone.

* * * * *